United States Patent
Yamada

(10) Patent No.: US 8,369,096 B2
(45) Date of Patent: Feb. 5, 2013

(54) ELECTRONIC APPARATUS

(75) Inventor: Motonari Yamada, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 12/687,791

(22) Filed: Jan. 14, 2010

(65) Prior Publication Data

US 2010/0188827 A1   Jul. 29, 2010

(30) Foreign Application Priority Data

Jan. 28, 2009   (JP) ................................ 2009-016216
Nov. 17, 2009   (JP) ................................ 2009-262065

(51) Int. Cl.
*H05K 5/00* (2006.01)
(52) U.S. Cl. .................... 361/752; 361/796; 361/800
(58) Field of Classification Search .................. 361/720, 361/748, 736, 760, 600, 679, 730, 752, 796, 361/800; 455/575.1–575.4, 575.7
See application file for complete search history.

(56) References Cited

U.S. PATENT DOCUMENTS

| | | | | |
|---|---|---|---|---|
| 7,379,667 B2 * | 5/2008 | Nabetani | ....................... | 396/539 |
| 7,936,278 B2 * | 5/2011 | Ahn et al. | ................... | 340/693.5 |
| 2008/0048610 A1 * | 2/2008 | Yen | ............................... | 320/107 |
| 2011/0025514 A1 * | 2/2011 | Gau | .......................... | 340/636.1 |

FOREIGN PATENT DOCUMENTS

| | | |
|---|---|---|
| EP | 1981049 | * 10/2008 |
| JP | 09-051153 A | 2/1997 |
| JP | 10-293150 A | 11/1998 |
| JP | 2002-314150 A | 10/2002 |
| JP | 2006-210739 A | 8/2006 |
| JP | 2007-116736 A | 5/2007 |

* cited by examiner

*Primary Examiner* — Hung S Bui
(74) *Attorney, Agent, or Firm* — Canon USA Inc. IP Division

(57) ABSTRACT

An electronic apparatus includes a wiring board, a main member to which the wiring board is fixed, a first component mounted rigidly on the wiring board and positioned with respect to the main member, and a second component mounted movably on the wiring board and positioned with respect to the main member, and a positioning portion provided on the wiring board to determine a position of the wiring board with respect to the main member, wherein a distance from the positioning portion to the first component is shorter than a distance from the positioning portion to the second component.

8 Claims, 5 Drawing Sheets

ELECTRONIC APPARATUS

BACKGROUND OF THE INVENTION

1. Field of the Invention

The present invention relates to an electronic apparatus configured to position a wiring board with a component mounted on the wiring board.

2. Description of the Related Art

As discussed in Japanese Patent Application Laid-Open No. 2007-116736, in an electronic apparatus such as a digital camera or a mobile telephone, a board on which an external connection terminal is mounted is positioned and fixed in an internal section of the electronic apparatus.

The number of boards that can be mounted in the internal section of the electronic apparatus has decreased as a result of recent progress in downsizing of such electronic apparatuses. Thus a large number of components must be mounted on a single board.

For example, a digital camera needs to include a battery contact connector for electrically connecting a battery, an opening/closing detection switch for a cover of the battery or the memory guide storage unit, and external connection terminals such as a Universal Serial Bus (USB) terminal or High-Definition Multimedia Interface (HDMI) terminal on a single board. These components are required to be positioned with a high positional accuracy with respect to the chassis or external member, and therefore the components are positioned and fixed by themselves separately.

However when mounting components on the board, the components may be mounted at a position that deviates from the designed position due to a deviation during the mounting procedure or the effect of tolerances.

When fixing a board on which components are mounted in this manner to an external member (cover) or chassis, since positioning with respect to the external member (cover) or chassis are executed respectively using components mounted on the board, an excessive load (stress) is applied to the board or components corresponding to the degree of deviation. This state causes problems such as destruction of the mounted components, peeling or cracking of the soldering connection sections as a result of the distortion or residual stress applied to the mounted components.

SUMMARY OF THE INVENTION

According to an aspect of the present invention, an electronic apparatus includes a wiring board, a main member to which the wiring board is fixed, a first component mounted rigidly on the wiring board and positioned with respect to the main member, and a second component mounted movably on the wiring board and positioned with respect to the main member, and a positioning portion provided on the wiring board to determine a position of the wiring board with respect to the main member, wherein a distance from the positioning portion to the first component is shorter than a distance from the positioning portion to the second component.

With the present invention, an excessive load (stress) is not applied to a board or components even when the position of the wiring board is determined by a component mounted on the wiring board other than the positioning portion. Consequently connection reliability can be improved by preventing fracture of components or of the wiring board.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
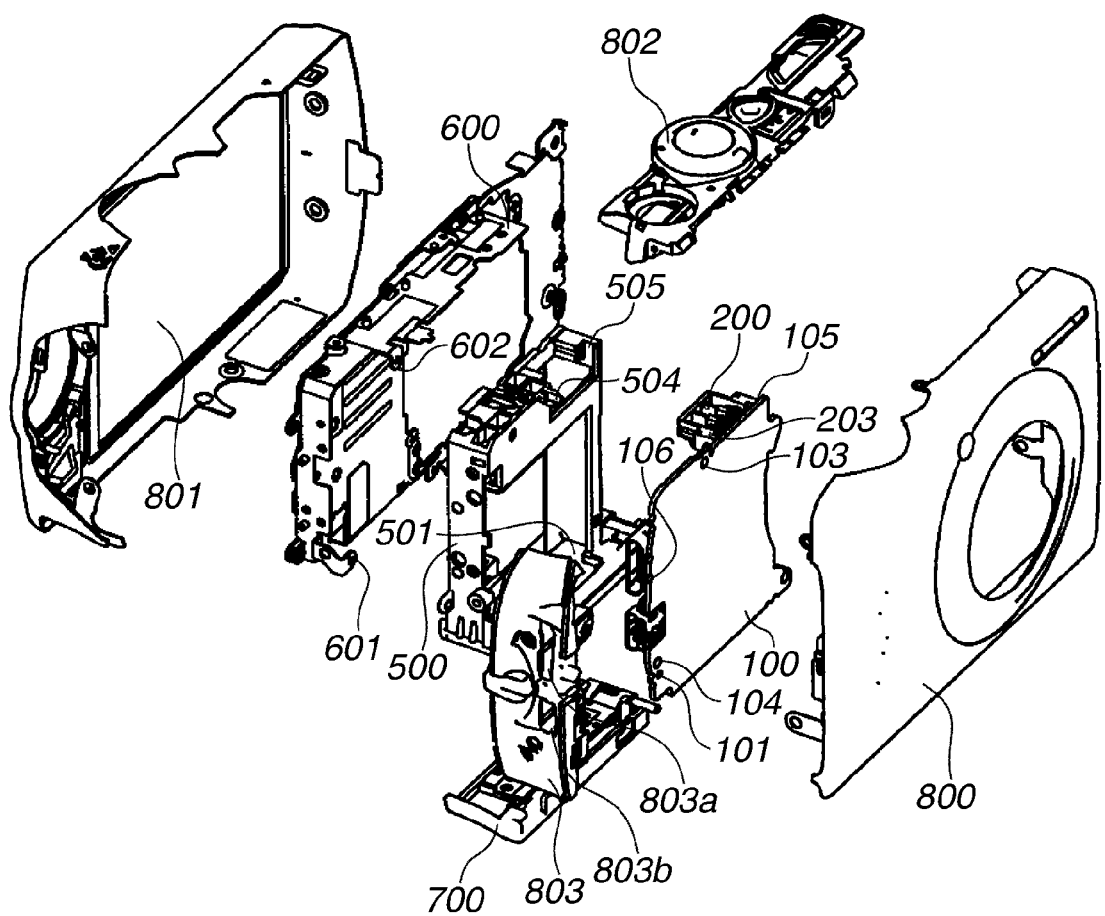
FIG. 1 is an exploded perspective view seen from the front side of a digital camera according to an exemplary embodiment of the present invention.
Figure 2:
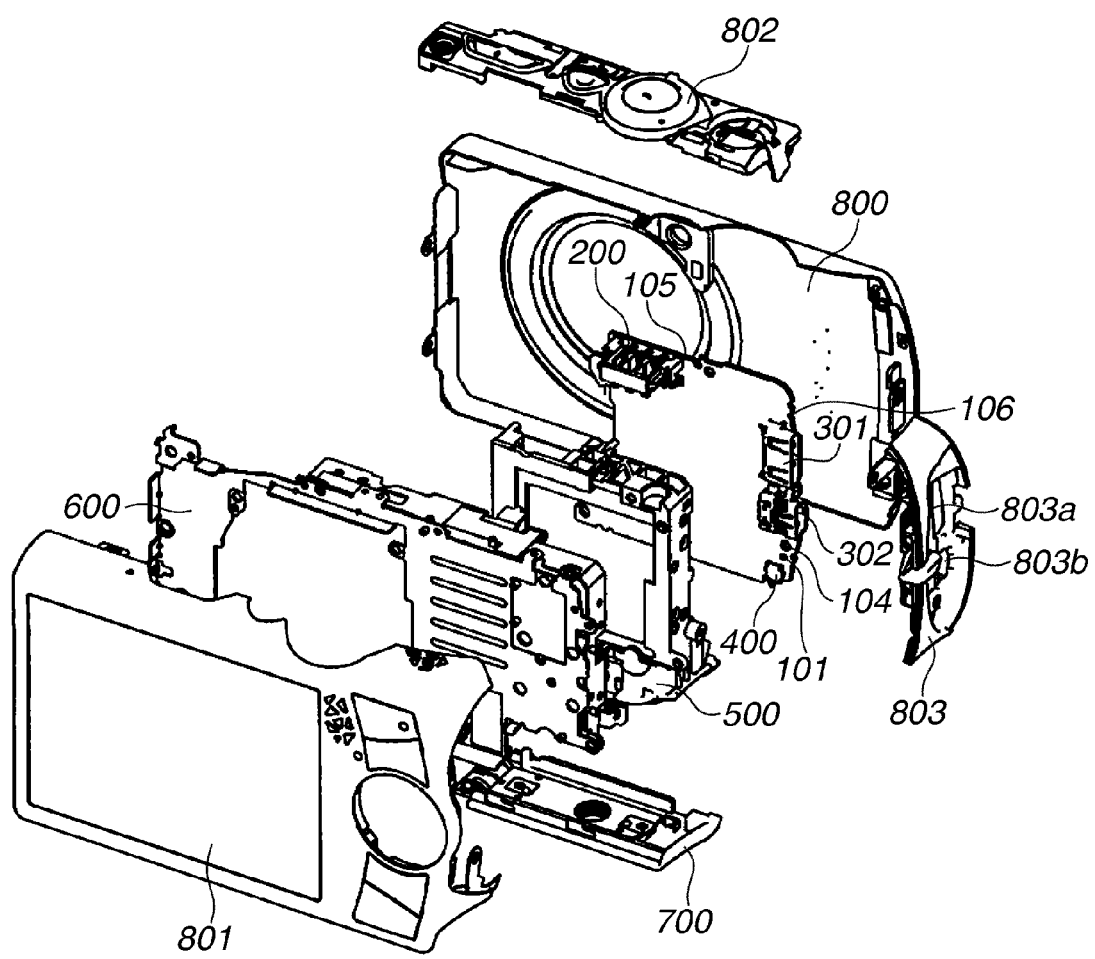
FIG. 2 is an exploded perspective view seen from the backside of the digital camera.

FIG. 1 is an exploded perspective view seen from the front side of a digital camera according to an exemplary embodiment of the present invention. FIG. 2 is an exploded perspective view seen from the back side of a digital camera. In the following description, although an example of the present invention will be described as applied to a digital camera, the present invention can be applied to electronic apparatuses including mobile information terminals (i.e., personal digital assistants (PDA)) and mobile telephones in addition to digital cameras.

In FIGS. 1 and 2, an electrical circuit is disposed on a wiring board 100. The wiring board 100 is fixed by a fixing screw to the main member 500. The main member 500 fixing the wiring board 100 is fixed to a main chassis 600 by a fixing screw.

Although omitted from the present embodiment, a lens unit is fixed to the main chassis 600. After fixing the main member 500 and the lens unit to the main chassis 600, a front cover 800, rear cover 801, top cover 802, and side cover 803 are assembled.

The wiring board 100 is formed in a substantially quadrilateral shape including a first end portion 105 and second end portion 106, which are adjacently disposed. A battery contact connector 200 including a battery contact blade is movably mounted on the first end portion 105 of the wiring board 100.

On the other hand, an HDMI terminal 301, a USB terminal 302, and a cover detection switch 400, which are external connection terminals for connection with an external apparatus are rigidly mounted on a periphery of the second end portion 106 of the wiring board 100.

A hole 803a and 803b configured to expose an insertion port for the HDMI terminal 301 and the USB terminal 302 are formed on the side cover 803. The insertion port for the HDMI terminal 301 is engaged with the hole 803a of the side cover 803 and the insertion port for the USB terminal 302 is engaged with the hole 803b of the side cover 803.

In this manner, the HDMI terminal 301 and the USB terminal 302 are positioned with reference to the side cover 803, which is an external member.

The main member 500 is configured to form a battery storage chamber in which a battery (not shown) is placed to enable power supply. An opening 501 is provided on one face of the main member 500 to enable insertion and removal of the battery in the battery storage chamber.

The cover 700 is configured to open and close the opening 501 of the main member 500 and is rotationally mounted on the main member 500. The cover detection switch 400 mounted on the wiring board 100 is configured to detect an open or closed state of the cover 700.

In other words, the cover detection switch 400 is positioned with respect to the main member 500 so that the distal tip 400a of the cover detection switch 400 protrudes from the opening 501 of the main member 500. When the cover 700 covers the opening 501, the switch is turned on because the cover 700 presses the distal tip 400a of the cover detection switch 400.

Figure 3:
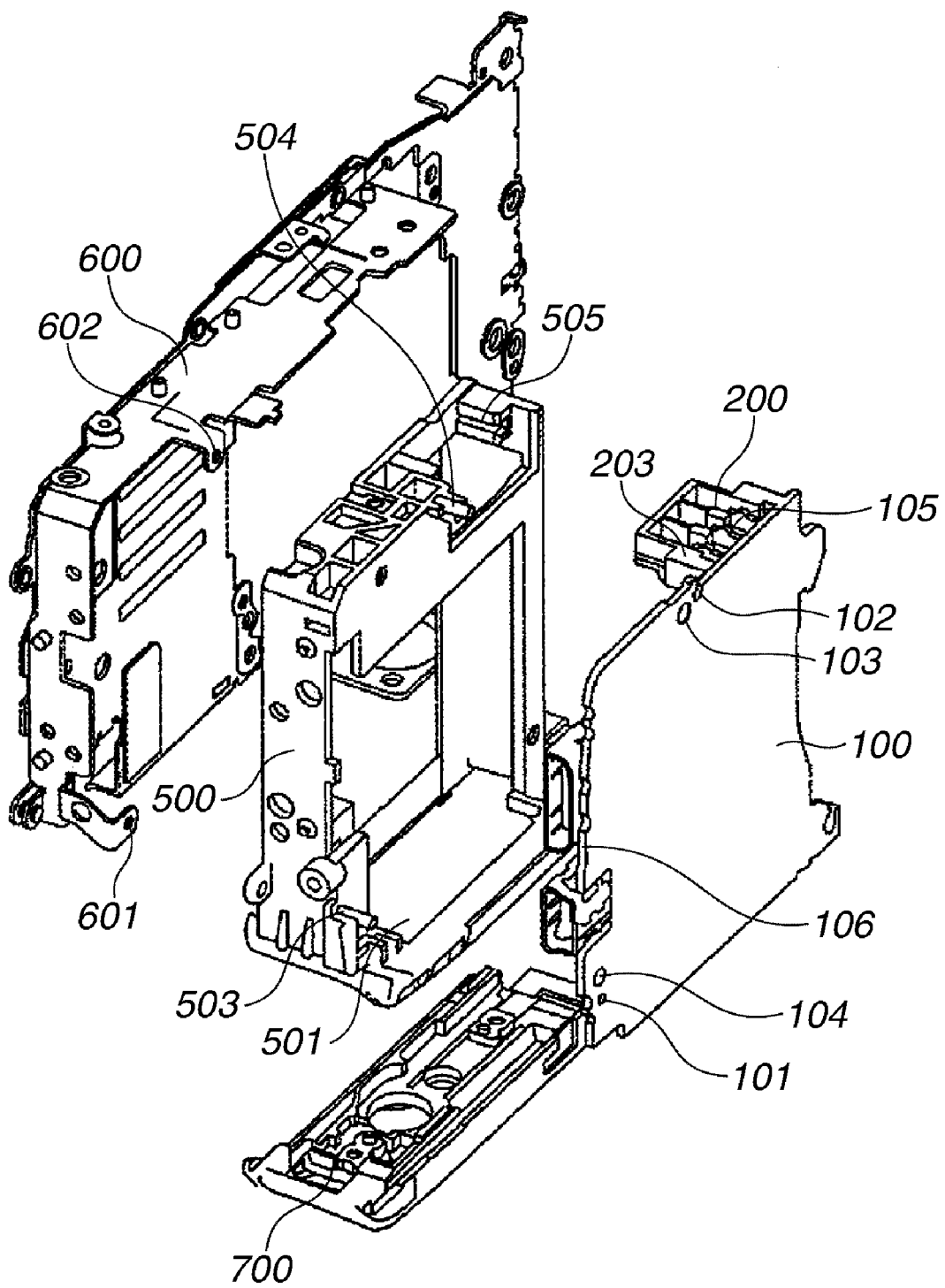
FIG. 3 illustrates a cover member, wiring board, main body member, and main chassis of a digital camera.
Figure 4:
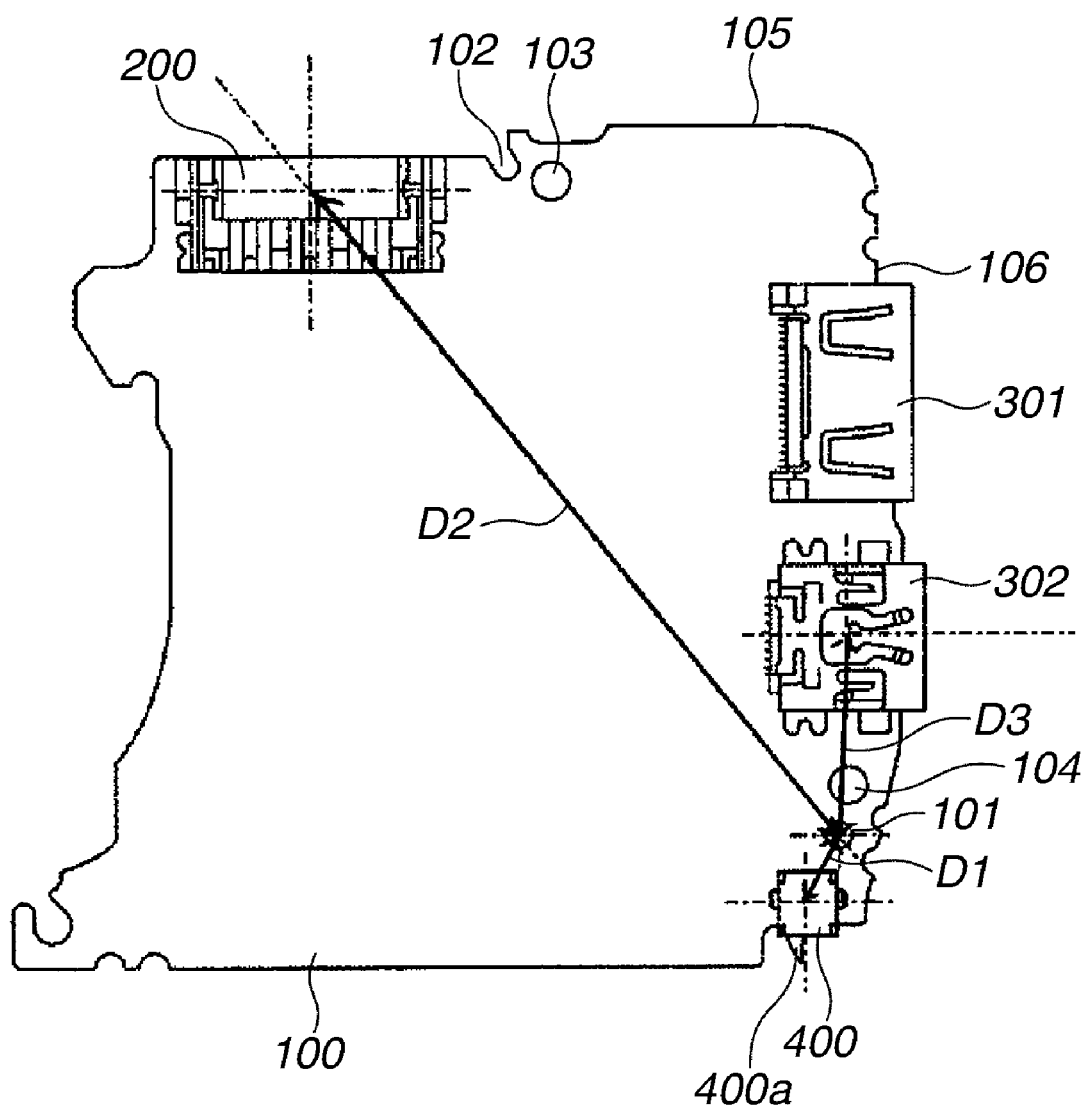
FIG. 4 illustrates the mounted positions of a cover detection switch, USB terminal, HDMI terminal, and battery contact connector for connecting with a battery on the wiring board.

Next, FIG. 3 illustrates a cover member, wiring board, main member, and main chassis of a digital camera. FIG. 4 illustrates the positions of a cover detection switch, USB terminal, HDMI terminal, and connector blade for battery, which is mounted on the wiring board.

In FIGS. 3 and 4, a positioning hole 101 is used to determine a position of the wiring board 100 when fixing the wiring board 100 to the main member 500 by engagement with the projection unit 503 of the main member 500.

The positioning hole 101 is provided at a position on a substantially diagonal line with respect to a position at which the battery contact connector 200 is mounted on the wiring board 100. The positioning hole 101 is provided in proximity to the cover detection switch 400 and the USB terminal 302, i.e., between the detection switch 400 and the USB terminal 302.

Thus as shown in FIG. 4, a distance D1 from the positioning hole 101 to the cover detection switch 400 is shorter than a distance D2 from the positioning hole 101 to the battery contact connector 200. Furthermore a distance D3 from the positioning hole 101 to the USB terminal 302 is shorter than the distance D2.

Since the cover detection switch 400 is mounted at a position near to the positioning hole 101, the positional accuracy of the cover detection switch 400 with respect to the main member 500 is improved, and more accurate detection of a closed state or an open state of the cover 700 is enabled.

The rotation stop hole 102 is configured to prevent the rotation of the wiring board 100 by engagement with the projection unit 504 of the main member 500. The rotation stop hole 102 is provided in proximity to the battery contact connector 200 on a substantially diagonal line with respect to the positioning hole 101 on the wiring board 100.

The wiring board 100 is provided with a first screw hole 103 (fixing portion) and a second screw hole 104 at a position corresponding to a board mounting hole 601, and 602 on the main chassis 600. The wiring board 100 is threadably fixed with the main chassis by tucking a fixing screw into each of the first screw hole 103 and the second screw hole 104.

The first screw hole 103 is provided in proximity to a first side 105 and a second screw hole 104 is provided in proximity to a second side 106. The first screw hole 103 is provided on the HDMI terminal 301 side with respect to the battery contact connector 200, and the second screw hole 104 is provided between the USB terminal 302 and the cover detection switch 400.

A force is applied to the respective terminals by insertion/removal of respective plugs into/from the HDMI terminal 301 or the USB terminal 302.

In this case, the force applied to the HDMI terminal 301 or the USB terminal 302 does not extend to the portion mounting the battery contact connector 200 or the cover detection switch 400. This is due to the fact that the wiring board 100 is fixed by the first screw hole 103 and the second screw hole 104 provided at the positions described above.

In other words, when respective plugs are inserted/removed into/from the HDMI terminal 301 or the USB terminal 302, the wiring board 100 is subjected to a force in the right-left direction of FIG. 4. At this time, if the first screw hole 103 is provided on the left side of the battery contact connector 200 in FIG. 4, the battery contact connector 200 is subjected to a force in a right-left direction in FIG. 4 as a result of the insertion/removal of the plugs.

In the same manner, when the second screw hole 104 is provided under the cover detection switch 400 in FIG. 4, the cover detection switch 400 is subjected to a force in a right-left direction in FIG. 4 as a result of the insertion of the plugs.

The position of the first screw hole 103 and the second screw hole 104 are determined in consideration of those described above in the present exemplary embodiment. In the present exemplary embodiment, this type of structure enables prevention of deviation of the wiring board 100 from the mounting position at manufacturing resulting from a force applied to the external connection terminal. Furthermore the wiring board 100 may be threadably fixed to the main member 500 within the scope of the present invention.

Figure 5:
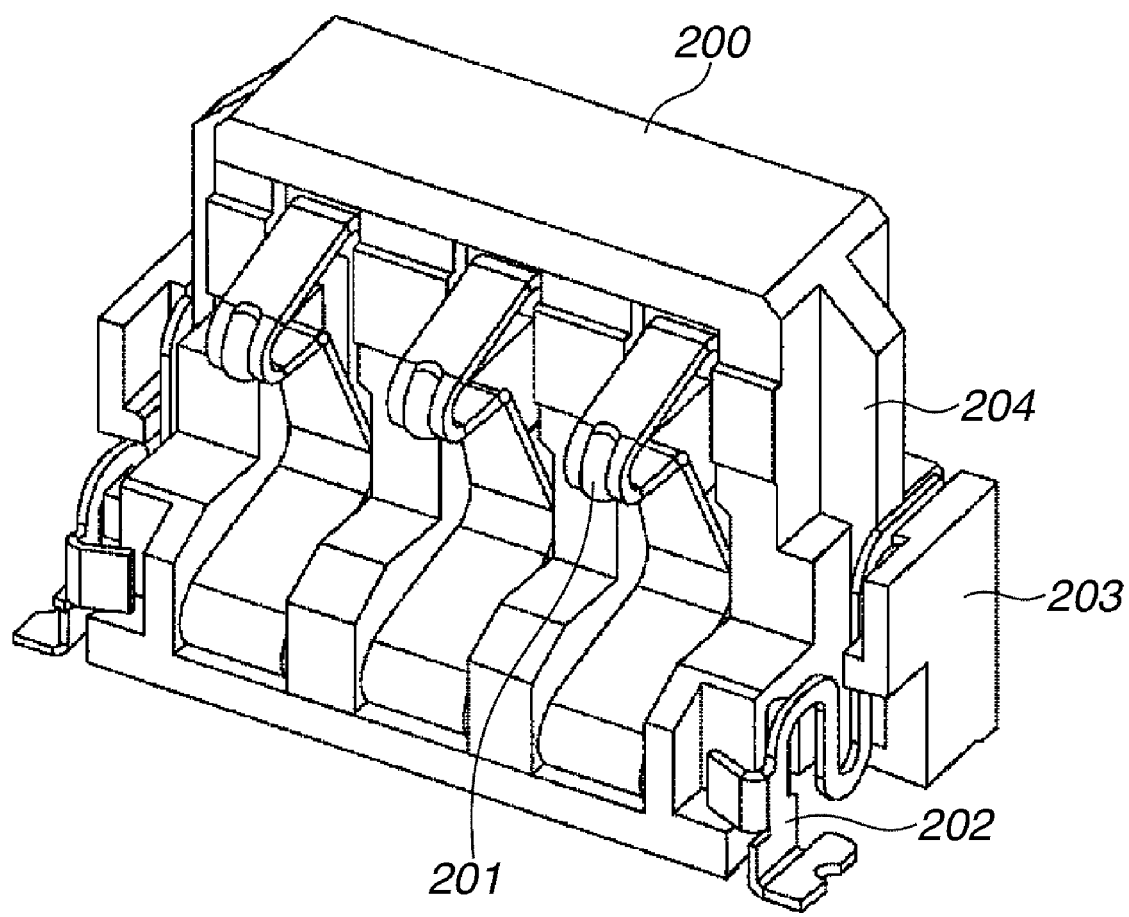
FIG. 5 illustrates the battery contact connector for connecting with a battery.

FIG. 5 illustrates the battery-contact connector 200. The battery contact blade 201 is configured to electrically connect the wiring board 100 with the electrode of the battery and to supply power to the wiring board 100. Reinforcing terminal 202 on the wiring board 100 reinforces the connection between the battery contact connector 200 and the wiring board 100 when the battery contact connector 200 is mounted on the wiring board 100.

The housing 203 retains the battery contact blade 201 and the reinforcing terminal 202. The housing 203 of the battery contact blade 201 does not contact with the wiring board 100, and the battery contact blade 201 is connected with the wiring board 100 only by the battery contact blade 201 and the reinforcing terminal 202. The battery contact blade 201 and the reinforcing terminal 202 are formed from flexible and electrically conductive materials.

Thus the housing 203 is mounted movably in a vertical direction, a transverse direction, and a rotational direction with respect to the wiring board 100. A rib 204 is formed on the housing 203 and is configured to engage with a fixing groove 505 formed on the main member 500. The battery contact connector 200 is positioned with respect to the main member 500 independently from the positioning of the wiring board 100 on the main member 500.

In this manner, the battery contact connector 200 is mounted moveably with respect to the wiring board 100 and therefore even when a mounting deviation occurs in the battery contact connector 200, the mounting deviation is absorbed by resilient properties of the battery contact blade 201 and the reinforcing terminal 202

The positioning hole 101 for determining the position of the wiring board 100 and the main member 500 is provided in proximity to the USB terminal 302 that is mounted rigidly and is provided at a position separated from the battery contact connector 200, which is mounted movably, by a long distance.

Consequently when the wiring board 100 is fixed to the main member 500, even if a rotational deviation occurs about the positioning hole 101, since the USB terminal 302 is disposed at a position separated from the positioning hole 101 by a short distance D3, an excessive force is seldom applied to the wiring board 100 or the USB terminal 302.

On the other hand, since the battery contact connector 200 is at a position separated from the positioning hole 101 by the longer distance D2, a load (stress) applied to the wiring board 100 or the battery contact connector 200 may be larger as a result of a rotational deviation about the positioning hole 101. However since the battery contact connector 200 is movably mounted on the wiring board 100, the load (stress) can be absorbed.

In the present exemplary embodiment, the structure of the battery contact connector 200 is not limited to the structure described above, and as long as the connector is movably mounted on the wiring board, a similar effect can be obtained.

According to the above description, a switch or external connection terminal mounted rigidly on the wiring board is provided in proximity to a positioning portion of the wiring board and a connector mounted movably on the wiring board is mounted at a position separated from the positioning portion for the wiring board by a longer distance.

When the wiring board is fixed to the main member, the above structure can prevent a large load (stress) applied to the switch or the external connection terminal rigidly mounted with respect to the wiring board even when a rotational deviation occurs in the wiring board. Thus the fracture of components or the wiring board can be prevented and connection reliability can be improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-016216 filed Jan. 28, 2009 and No. 2009-262065 filed Nov. 17, 2009, which are hereby incorporated by reference herein in their entirety.

What is claimed is:

1. An electronic apparatus comprising:
   a wiring board;
   a main member to which the wiring board is fixed, wherein the main member having a battery storage chamber for storing a battery;
   a cover member movably mounted on the main member;
   a detection switch configured to detect state of the cover member, wherein the switch is mounted rigidly on the wiring board and positioned with respect to the main member;
   a connector mounted on the wiring board and positioned with respect to the main member, wherein the connector includes a battery contact blade which is electrically connected with the battery stored in the battery storage chamber, wherein a mounting deviation of the connector is absorbed by resilient property of the battery contact blade; and
   a positioning portion provided on the wiring board to determine a position of the wiring board with respect to the main member;
   wherein a distance from the positioning portion to the detection switch is shorter than a distance from the positioning portion to the connector.

2. The electronic apparatus according to claim 1, wherein the cover member is arranged to open or close the battery storage chamber, and
   wherein the detection switch is configured to detect whether the cover member of the battery storage chamber is in an open or closed state.

3. The electronic apparatus according to claim 1, further comprising:
   an external member of the electronic apparatus that covers the wiring board; and
   an external connection terminal mounted rigidly on the wiring board for connecting with an external apparatus and positioned with respect to the external member,
   wherein a distance from the positioning portion to the external connection terminal is shorter than a distance from the positioning portion to the connector.

4. The electronic apparatus according to claim 3, wherein the positioning portion is positioned between the detection switch and the external connection terminal.

5. The electronic apparatus according to claim 4, wherein a fixing portion for fixing the wiring board to the main member is provided on the wiring board, and the fixing portion is positioned nearer the external connection terminal than the positioning portion.

6. The electronic apparatus according to claim 1, wherein a position of the detection switch and a position of the connector is positioned diagonally on the wiring board.

7. An electronic apparatus comprising:
   a wiring board;
   a main member to which the wiring board is fixed;
   an external member of the electronic apparatus that covers the wiring board;
   an external connection terminal mounted rigidly on the wiring board for connecting with an external apparatus and positioned with respect to the external member;
   a connector mounted movably on the wiring board and positioned with respect to the main member, wherein the connector includes a mounting deviation absorbing structure; and
   a positioning portion provided on the wiring board to determine a position of the wiring board with respect to the main member,
   wherein a distance from the positioning portion to the external connection terminal is shorter than a distance from the positioning portion to the connector.

8. The electronic apparatus according to claim 7, wherein a battery storage chamber for storing a battery is formed with the main member,
   wherein the connector includes a battery contact blade, which is electrically connected with the battery stored in the battery storage chamber, and
   wherein a mounting deviation of the connector is absorbed by resilient property of the battery contact blade.

* * * * *